United States Patent
Hasegawa et al.

(10) Patent No.: US 6,930,340 B2
(45) Date of Patent: Aug. 16, 2005

(54) MEMORY CELL ARRAY INCLUDING FERROELECTRIC CAPACITORS, METHOD FOR MAKING THE SAME, AND FERROELECTRIC MEMORY DEVICE

(75) Inventors: Kazumasa Hasegawa, Fujimi-machi (JP); Eiji Natori, Chino (JP); Masao Nakayama, Chino (JP); Tatsuo Sawasaki, Fujimi-machi (JP); Hiroaki Tamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/376,609

(22) Filed: Mar. 3, 2003

(65) Prior Publication Data
US 2004/0173827 A1 Sep. 9, 2004

(51) Int. Cl.[7] ............................................. H01L 31/062
(52) U.S. Cl. ................................. 257/295; 257/E27.104
(58) Field of Search .......................... 257/295, E27.104

(56) References Cited

U.S. PATENT DOCUMENTS

| | | | | |
|---|---|---|---|---|
| 5,579,258 A | * | 11/1996 | Adachi | 365/145 |
| 6,094,370 A | * | 7/2000 | Takashima | 365/145 |
| 6,529,398 B1 | * | 3/2003 | Nair et al. | 365/145 |
| 6,548,844 B1 | * | 4/2003 | Fukuzumi et al. | 257/296 |
| 6,574,135 B1 | * | 6/2003 | Komatsuzaki | 365/145 |
| 6,734,478 B2 | * | 5/2004 | Johansson et al. | 257/295 |
| 6,747,353 B2 | * | 6/2004 | Oizumi et al. | 257/751 |
| 2002/0127867 A1 | * | 9/2002 | Lee | 438/694 |
| 2003/0057462 A1 | * | 3/2003 | An | 257/295 |
| 2004/0174728 A1 | * | 9/2004 | Takano et al. | 365/145 |

* cited by examiner

*Primary Examiner*—David Nelms
*Assistant Examiner*—Tu-Tu Ho
(74) *Attorney, Agent, or Firm*—Oliff & Berridge, PLC

(57) ABSTRACT

A memory cell array is provided that includes ferroelectric capacitors with enhanced characteristics, a method of making the same, and a ferroelectric memory device including the memory cell.

In a memory cell array, memory cells including ferroelectric capacitors are arrayed in a matrix. Each ferroelectric capacitor includes a lower electrode, an upper electrode, and a ferroelectric section disposed between the lower electrode and the upper electrode. The ferroelectric section is disposed in an intersection between the lower electrode and the upper electrode. An intermediate electrode is disposed between the ferroelectric section 14 and the upper electrode.

11 Claims, 10 Drawing Sheets

MEMORY CELL ARRAY INCLUDING FERROELECTRIC CAPACITORS, METHOD FOR MAKING THE SAME, AND FERROELECTRIC MEMORY DEVICE

BACKGROUND OF THE INVENTION

1. Field of Invention

The present invention relates to memory cell arrays including ferroelectric capacitors. More particularly, the invention relates to a passive-matrix memory cell array using only ferroelectric capacitors without using cell transistors, a method for making the same, and a ferroelectric memory device including the memory cell array.

2. Description of Related Art

The related art includes passive-matrix memory cell arrays using only ferroelectric capacitors without using cell transistors which are advantageous due to their extremely simple structures and high integration degrees.

SUMMARY OF THE INVENTION

The present invention provides a memory cell array including ferroelectric capacitors with enhanced characteristics, a method of making the same, and a ferroelectric memory device including the memory cell array of the present invention.

1. Memory Cell Array

In accordance with the present invention, a memory cell array provided with ferroelectric capacitors includes memory cells arrayed in a matrix, the memory cells including the ferroelectric capacitors, each ferroelectric capacitor including a lower electrode, an upper electrode, and a ferroelectric section disposed between the lower electrode and the upper electrode. The ferroelectric section is disposed in an intersection between the lower electrode and the upper electrode. An intermediate electrode is disposed between the ferroelectric section and the upper electrode.

In the memory cell array of the present invention, the ferroelectric section is disposed in the intersection between the lower electrode and the upper electrode. Consequently, leakage of the line of electric force from the inside of the ferroelectric capacitor to the outside of the ferroelectric capacitor region is prevented. Therefore, as described below, it is possible to enhance the rectangularity of the hysteresis loop of the ferroelectric capacitor. As a result, in accordance with the present invention, it is possible to enhance the characteristics of the ferroelectric capacitor.

The memory cell array of the present invention may have at least one of the following structures.

(1) An insulating layer may be disposed so as to cover at least the side faces of the lower electrode in the ferroelectric capacitor. Consequently, short-circuiting between the lower electrode and the upper electrode can be prevented.

In such a structure, in the ferroelectric capacitor the insulating layer may cover the side faces of the lower electrode, the ferroelectric layer, and the intermediate electrode.

In such a case, the insulating layer may be disposed under the upper electrode.

(2) At least a part of the insulating layer may be composed of a hydrogen barrier film. Consequently, the ferroelectric section is prevented from being reduced by hydrogen.

2. Method of Making Memory Cell Array

In accordance with the present invention, a method of making a memory cell array in which memory cells including ferroelectric capacitors are arrayed in a matrix includes:

(a) forming a first conductive layer on a substrate;

(b) forming a ferroelectric layer on the first conductive layer;

(c) forming a second conductive layer on the ferroelectric layer;

(d) patterning at least the ferroelectric layer and the second conductive layer;

(e) forming an insulating layer so as to cover the laminates, each including the first conductive layer, the ferroelectric layer, and the second conductive layer, on the substrate;

(f) removing the insulating layer until the upper surface of the second conductive layer is exposed; and (g) forming a third conductive layer having a predetermined pattern so as to partially overlie the second conductive layer.

In the present invention, the second conductive layer is formed on the ferroelectric layer. Consequently, when the insulating layer is removed in step (f), the ferroelectric layer is protected by the second conductive layer. Therefore, the structure of the surface of the ferroelectric layer does not become disordered, and degradation in characteristics can be prevented. That is, the capacitors are prevented from being damaged.

The method of making the memory cell array of the present invention may include the following modes.

(1) The first conductive layer may be patterned in step (d). In such a case, the first conductive layer, the ferroelectric layer, and the second conductive layer can be patterned simultaneously. Additionally, since the ferroelectric layer is formed on the unpatterned first conductive layer, the ferroelectric layer can be easily formed.

(2) A step of patterning the first conductive layer may be included prior to step (b).

(3) In order to perform step (d), a step of forming a mask layer having a predetermined pattern on the second conductive layer may be included, and in step (f), the insulating layer and the mask layer may be removed.

(4) The mask may be composed of any one of silicon nitride, silicon oxide, and titanium nitride.

(5) After step (g), the second conductive layer and the ferroelectric layer may be patterned. Consequently, the ferroelectric layer can be formed only in the intersecting regions between the first electrode layer and the second electrode layer.

(6) The insulating layer may include a hydrogen barrier film.

3. Ferroelectric Memory Device

A ferroelectric memory device of the present invention includes the memory cell array of the present invention.

DETAILED DESCRIPTION OF PREFERRED EMBODIMENTS

Exemplary embodiments of the present invention are described below with reference to the drawings.

1. First Exemplary Embodiment 1.1 Structure of Device

Figure 1:
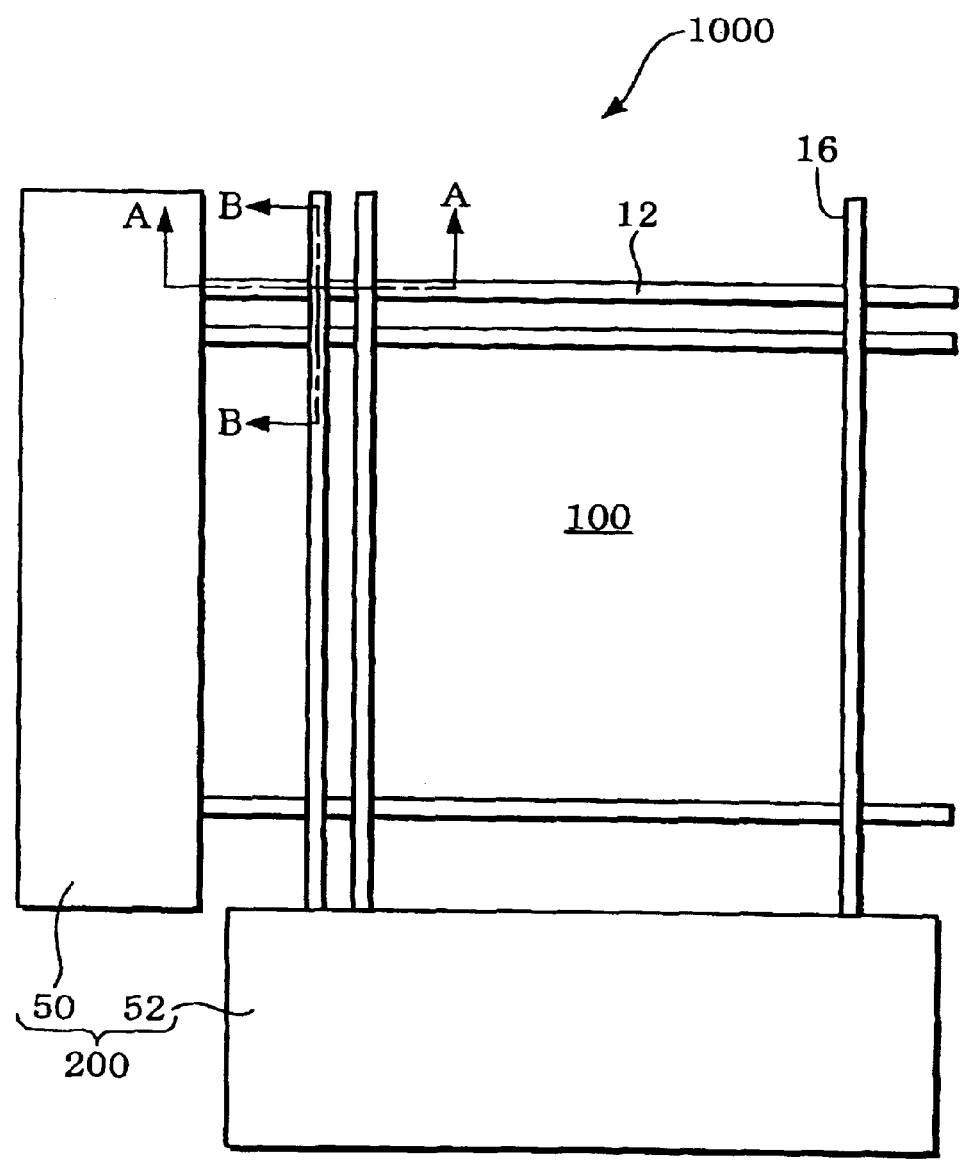
FIG. 1 is a plan view schematically showing a ferroelectric memory device in a first exemplary embodiment.
Figure 2:
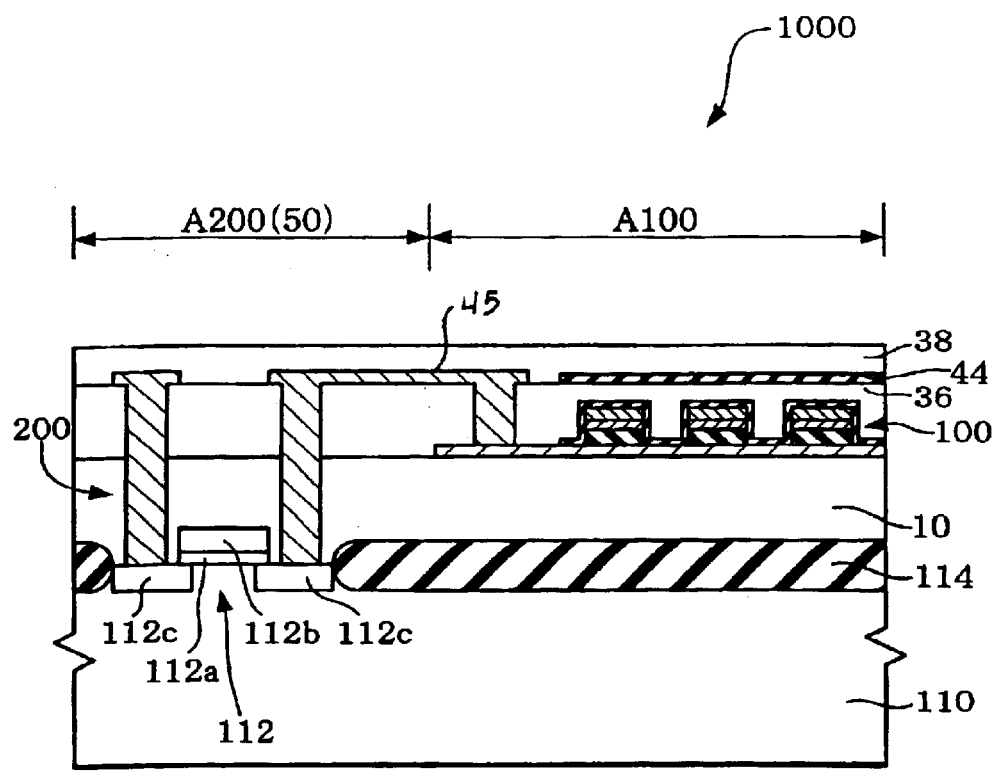
FIG. 2 is a sectional view taken along plane A—A of FIG. 1, which schematically shows a part of the ferroelectric memory device.
Figure 3:
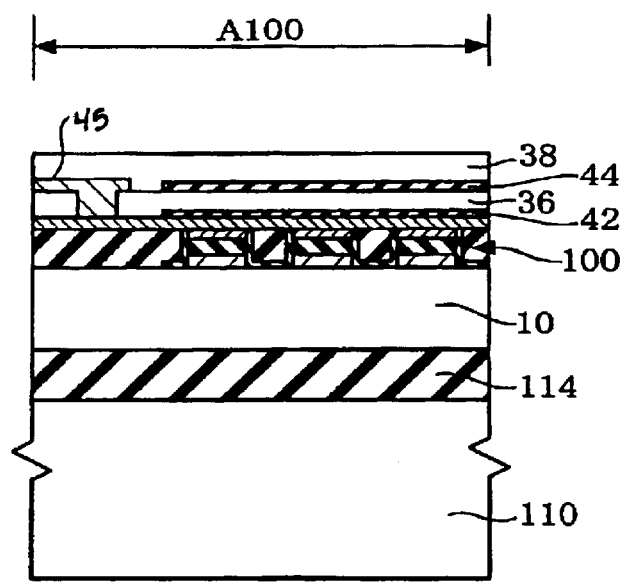
FIG. 3 is a sectional view taken along plane B—B of FIG. 1, which schematically shows a part of the ferroelectric memory device.
Figure 4:
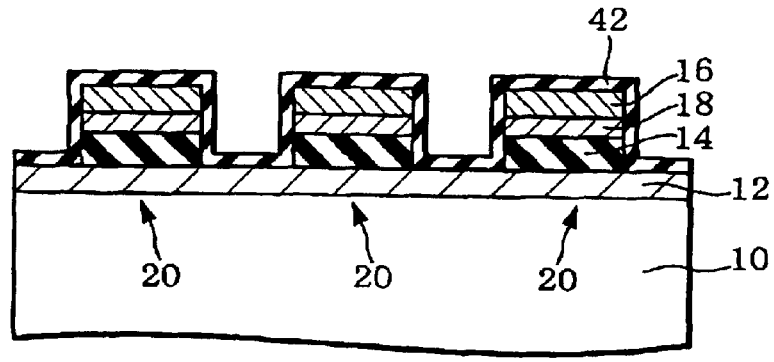
FIG. 4 is an enlarged sectional view schematically showing a memory cell array shown in FIG. 2.
Figure 5:
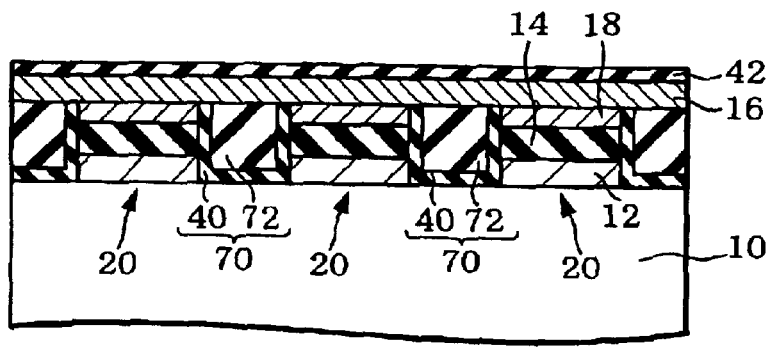
FIG. 5 is an enlarged sectional view schematically showing a memory cell array shown in FIG. 3.

FIG. 1 is a plan view schematically showing a ferroelectric memory device in a first exemplary embodiment. FIG. 2 is a sectional view taken along plane A—A of FIG. 1, which schematically shows a part of the ferroelectric memory device. FIG. 3 is a sectional view taken along plane B—B of FIG. 1, which schematically shows a part of the ferroelectric memory device. FIG. 4 is an enlarged sectional view schematically showing a memory cell array shown in FIG. 2. FIG. 5 is an enlarged sectional view schematically showing a memory cell array shown in FIG. 3.

In this exemplary embodiment, a ferroelectric memory device 1000 includes a memory cell array 100 and a peripheral circuit unit 200. The memory cell array 100 and the peripheral circuit unit 200 are formed on different layers. The peripheral circuit unit 200 is disposed in an area outside the memory cell array 100. Specifically, an area A200 in which the peripheral section is formed is provided at an area outside an area A100 in which the memory cell array is formed. In this exemplary embodiment, the peripheral circuit unit 200 is formed on a lower layer and the memory cell array 100 is formed on an upper layer. Specific examples of the peripheral circuit unit 200 include Y gates, sense amplifiers, input-output buffers, X address decoders, Y address decoders, and address buffers.

In the memory cell array 100, lower electrodes (word lines) 12 to select rows and upper electrodes (bit lines) 16 to select columns are arrayed so as to be orthogonal to each other. That is, the lower electrodes 12 are arrayed at a predetermined pitch in the X direction, and the upper electrodes 16 are arrayed at a predetermined pitch in the Y direction that is orthogonal to the X direction. Additionally, the lower electrodes 12 may be bit lines and the upper electrodes 16 may be word lines.

In this exemplary embodiment, the memory cell array 100 is disposed on a first intralayer insulating layer 10 as shown in FIGS. 2 and 3. In the memory cell array 100, as shown in FIGS. 4 and 5, the lower electrodes 12, ferroelectric sections 14 constituting ferroelectric capacitors, intermediate electrodes 18, and the upper electrodes (top electrodes) 16 are deposited on the first intralayer insulating layer 10. The ferroelectric sections 14 and the intermediate electrodes 18 are disposed in the intersections between the lower electrodes 12 and the upper electrodes 16. That is, a memory cell including a ferroelectric capacitor 20 is formed in each intersection between the lower electrodes 12 and the upper electrodes 16.

As shown in FIG. 5, insulating layers 70 are formed so as to cover at least the lower electrodes 12 in the ferroelectric capacitor 20. The insulating layers 70 are disposed between adjacent ferroelectric capacitors below the upper electrode 16. The presence of the insulating layers 70 prevents short-circuiting between the lower electrode 12 and the intermediate electrode 18 or the upper electrode 16. The insulating layer 70 may have a laminated structure including an insulative first hydrogen barrier film 40 and a first insulating layer 72. By forming the first hydrogen barrier film 40, the ferroelectric section 14 of the ferroelectric capacitor 20 is prevented from being reduced. Additionally, only the insulating layer 72 may constitute the insulating layer 70.

As shown in FIGS. 4 and 5, a second hydrogen barrier film 42 may be formed so as to cover the ferroelectric capacitors 20. By forming the second hydrogen barrier film 42, the ferroelectric section 14 of the ferroelectric capacitor 20 is prevented from being reduced.

As shown in FIGS. 2 and 3, a first protective layer 36 is disposed over the first intralayer insulating layer 10 so as to cover the memory cell array 100. As necessary, a third hydrogen barrier film 44 is disposed on the first protective layer 36. The third hydrogen barrier film 44 may be formed in the memory cell array area A100. That is, it is possible to provide a structure in which the first, second, and third hydrogen barrier films 40, 42, and 44 are not formed in the peripheral circuit area A200. Consequently, by performing heat treatment in the subsequent step, the peripheral circuit area A200 can be recovered by hydrogen, and the memory cell array 100 can be prevented from being reduced by hydrogen.

Furthermore, an insulative second protective layer 38 is formed over the first protective layer 36 so as to cover a first wiring layer 45. By forming the third hydrogen barrier film 44, the ferroelectric capacitor is prevented from being damaged in the step of forming the second protective layer 38.

As shown in FIG. 1, the peripheral circuit unit 200 includes various circuits to selectively write or reading information in or from the memory cells. For example, the peripheral circuit unit 200 includes a first driving circuit 50 to selectively control the lower electrodes 12, a second driving circuit 52 to selectively control the upper electrodes 34, a signal detection circuit, such as a sense amplifier (not shown in the drawing).

As shown in FIG. 2, the peripheral circuit unit 200 includes a MOS transistor 112 formed on a semiconductor substrate 110. The MOS transistor 112 includes a gate insulating layer 112a, a gate electrode 112b, and source/drain regions 112c. The individual MOS transistors 112 are isolated from each other by an element isolation region 114. The first intralayer insulating layer 10 is formed over the semiconductor substrate 110 provided with the MOS transistors 112. The peripheral circuit unit 200 and the memory cell array 100 are electrically connected to each other by the first wiring layer 45.

An example of a write and read operation in the ferroelectric memory device 1000 in this exemplary embodiment is described below.

In the read operation, a read voltage "$V_0$" is applied to the capacitor of a selected cell. This also performs a write operation for a "0". At this stage, the current flowing through the selected bit line or the potential when high impedance is applied to the bit line is read with a sense amplifier. In order to prevent cross-talk during reading, a predetermined voltage is applied to the capacitor of the non-selected cell.

In the write operation, when a "1" is written, a voltage "$-V_0$" is applied to the capacitor of the selected cell. When a "0" is written, a voltage that does not reverse the polarization of the selected cell is applied to the selected cell, and the "0" state written in the read operation is retained. At this stage, in order to prevent cross-talk during writing, a predetermined voltage is applied to the capacitor of the non-selected cell.

1.2 Working Effect

The working effects of the ferroelectric memory device 1000 in this exemplary embodiment are described below.

The ferroelectric section 14 is disposed in the intersection between the upper electrode 12 and the lower electrode 16. Consequently, leakage of the line of electric force from the capacitor is prevented. As a result, a region to which a weak electric field is applied is eliminated in the ferroelectric section 14 when a voltage is applied. Therefore, the rectangularity of the hysteresis loop is enhanced. That is, the shape of the hysteresis loop can be brought close to a rectangle. As a result, in the ferroelectric memory device 1000 in this exemplary embodiment, the operational characteristics of the ferroelectric capacitors 20 can be enhanced.

2. Second Exemplary Embodiment

2.1 Process

An example of a method of fabricating the ferroelectric memory device described above is described below. FIGS. 6 to 14 are sectional views which schematically show fabrication steps of a ferroelectric memory device 1000. Additionally, FIGS. 7 to 14 are sectional views in which only the memory cell array area is taken notice of.

Figure 6:
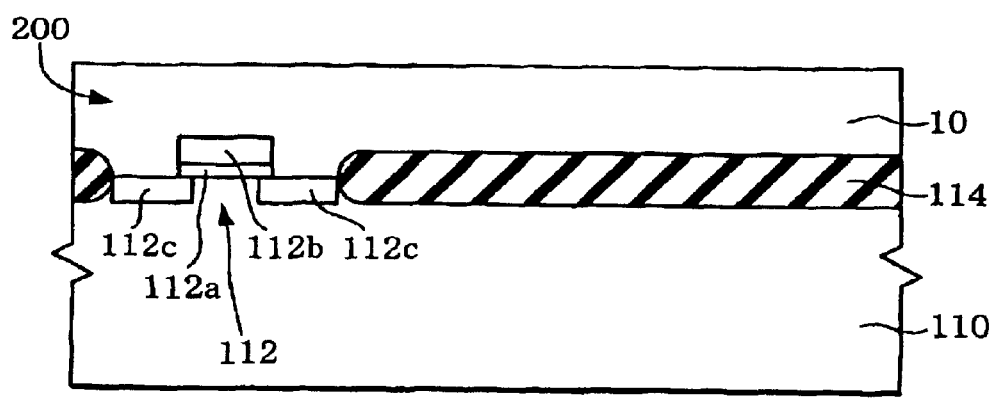
FIG. 6 is a sectional view schematically showing a fabrication step of a ferroelectric memory device.

As shown in FIG. 6, a peripheral circuit unit 200 is formed using related art or known LSI processes. Specifically, a MOS transistor 112 is formed on a semiconductor substrate 110.

For example, an element isolation region 114 is formed in a predetermined region on the semiconductor substrate 110 using a trench isolation process, a LOCOS process, or the like, and a gate insulating layer 112a and a gate electrode 112b are formed. By doping the semiconductor substrate 110 with an impurity, source/drain regions 112c are then formed. The peripheral circuit unit 200 including various circuits, such as driving circuits 50 and 52 and a signal detection circuit 54, is thereby formed.

A first intralayer insulating layer 10 is then formed by a related art known process.

Next, a memory cell array area A100 is formed on the first intralayer insulating layer 10. A method of making the memory cell array 100 is described below with reference to FIGS. 7 to 14.

Figure 7:
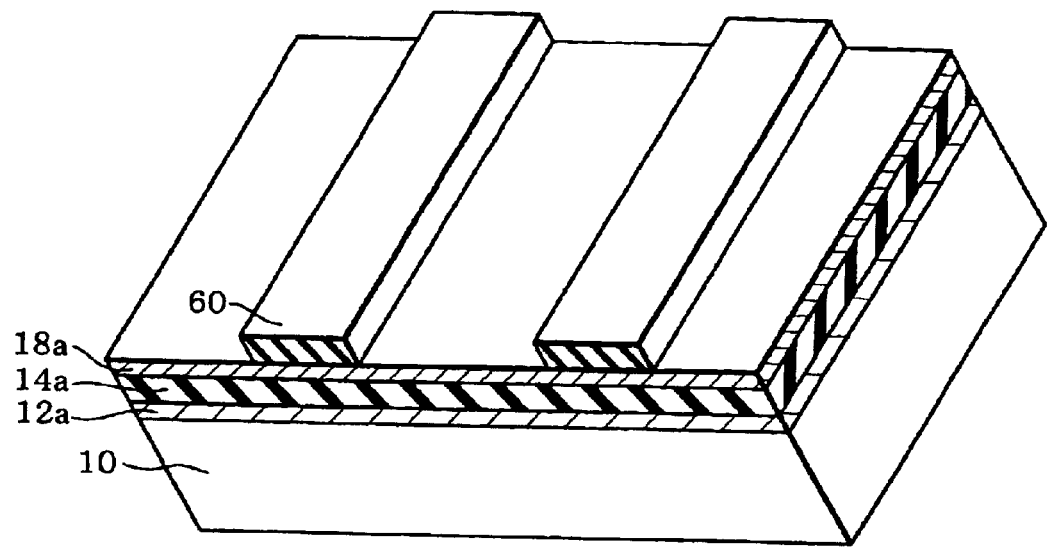
FIG. 7 is a sectional view schematically showing a fabrication step of a ferroelectric memory device.

First, as shown in FIG. 7, a first conductive layer 12a for lower electrodes 12 is formed on the first intralayer insulating layer 10. The material for the first conductive layer 12a is not particularly limited as long as it serves as an electrode of a ferroelectric capacitor. Examples of the material for the first conductive layer 12a include Ir, $IrO_x$, Pt, $RuO_x$, $SrRuO_x$, and $LaSrCoO_x$. The first conductive layer 12a may be single-layered or multi-layered. For example, a contact layer composed of $TiO_x$ or the like may be formed under the conductive material. In order to form the first conductive layer 12a, sputtering, vacuum deposition, CVD, or the like may be used.

Next, a ferroelectric layer 14a for ferroelectric sections 14 is formed on the first conductive layer 12a. As the material for the ferroelectric layer 14a, any composition may be used as long as it exhibits ferroelectricity and serves as a capacitor insulating layer. Examples of such a ferroelectric material include PZT ($PbZr_zTi_{1-z}O_3$) and SBT ($SrBi_2Ta_2O_9$). A metal, such as niobium, nickel, or magnesium, may be added to the ferroelectric material for use. In order to form the ferroelectric layer 14a, for example, a spin-coating process using a sol-gel material or MOD material, a dipping process, a sputtering process, a MOCVD process, or a laser ablation process may be used.

Next, a second conductive layer 18a for intermediate electrodes 18 is formed on the ferroelectric layer 14a. In order to form the second conductive layer 18a, the same material and method as those for the first conductive layer 12a may be used.

A mask layer 60 is then formed over the entire surface, and the mask layer 60 is patterned by lithography and etching so as to have a predetermined pattern. That is, the mask layer 60 is formed in the region in which the lower electrode 12 is formed. The material for the mask layer 60 is not particularly limited as long as it functions as a mask when the second conductive layer 18a, the ferroelectric layer 14a, and the first conductive layer 12a are etched. For example, silicon nitride, silicon oxide, or titanium nitride may be used. The mask layer 60 may be formed, for example, by a CVD process.

Figure 8:
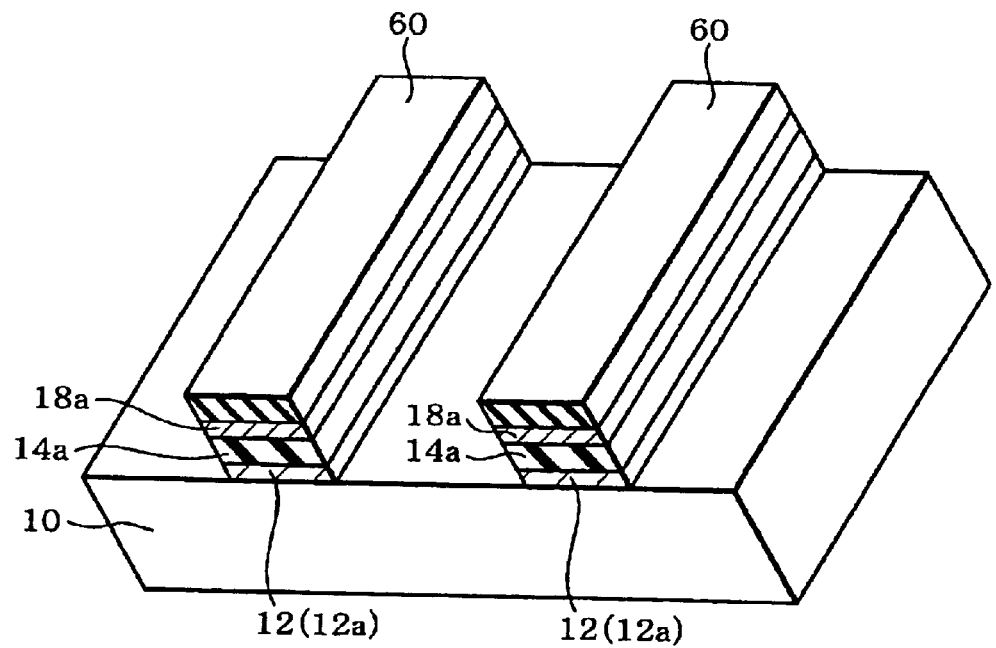
FIG. 8 is a sectional view schematically showing a fabrication step of a ferroelectric memory device.

Next, as shown in FIG. 8, using the mask layer 60 as a mask, the second conductive layer 18a, the ferroelectric layer 14a, and the first conductive layer 12a are etched to pattern the second conductive layer 18a, the ferroelectric layer 14a, and the first conductive layer 12a. By patterning the first conductive layer 12a, the lower electrodes 12 with a predetermined pattern are formed. As the etching method, RIE, ion milling, or high-density plasma etching, such as ICP (Inductively Coupled Plasma), may be used.

Figure 9:
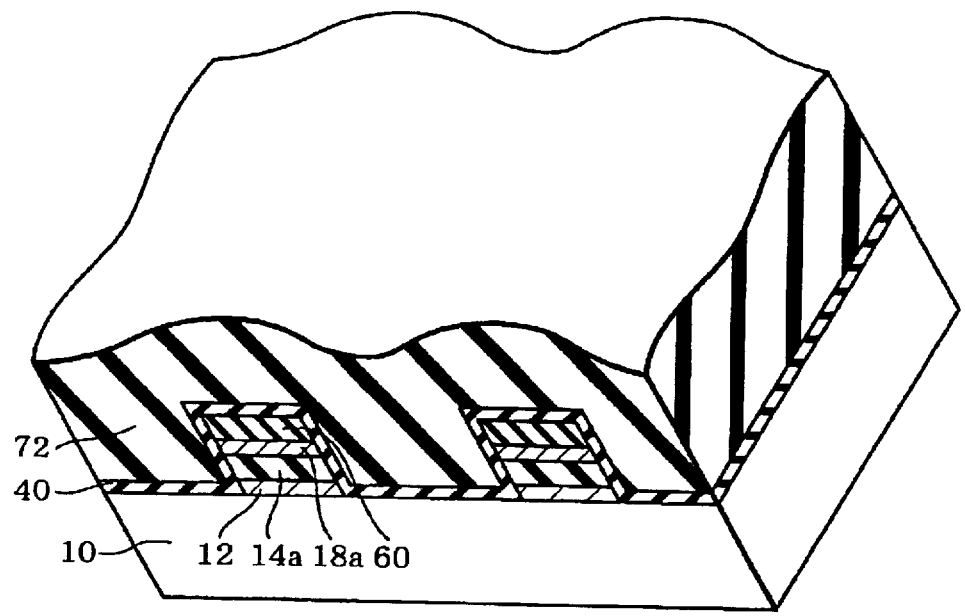
FIG. 9 is a sectional view schematically showing a fabrication step of a ferroelectric memory device.

Next, as necessary, as shown in FIG. 9, a first hydrogen barrier film 40 is formed over the entire surface. The material for the first hydrogen barrier film 40 is not particularly limited as long as it prevents the ferroelectric layer 14a from being reduced by hydrogen. For example, aluminum oxide, titanium oxide, or magnesium oxide may be used. In order to form the first hydrogen barrier film 40, a sputtering process, a CVD process, a laser ablation process may be used.

Next, a first insulating layer 72 is formed over the entire surface. The material for the first insulating layer 72 is not particularly limited as long as it can be etched at the same etching rate as that of the mask layer in the subsequent etch-back step for the first insulating layer. For example, silicon oxide or aluminum oxide may be used. In order to form the first insulating layer 72, for example, a CVD process is used. The first insulating layer 72 is formed so as to fill the spaces between the laminates, each including the lower electrode 12, the ferroelectric layer 14a, the second conductive layer 18a, and the mask layer 60 (hereinafter "laminates").

Figure 10:
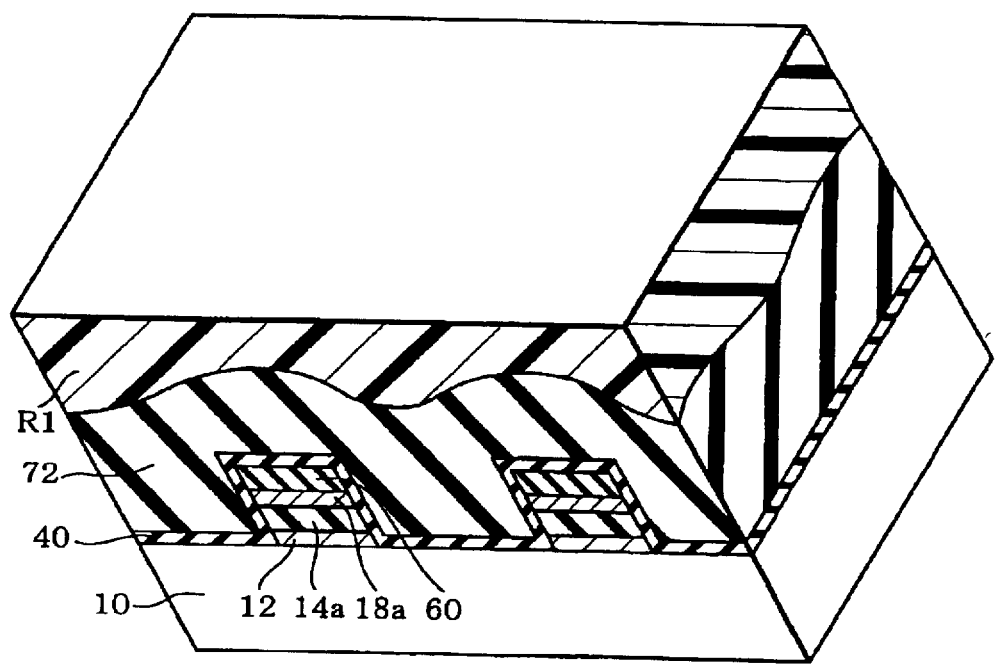
FIG. 10 is a sectional view schematically showing a fabrication step of a ferroelectric memory device.

Next, as shown in FIG. 10, a resist layer R1 is formed on the first insulating layer 72. The resist layer R1 is formed so that the upper surface thereof is planar. Additionally, when the first insulating layer 72 with a planar upper surface is formed using a coating method, the resist layer R1 may be omitted. Specifically, when the first insulating layer 72 is composed of a SOG (Spin On Glass) layer, the resist layer R1 may be omitted.

Figure 11:
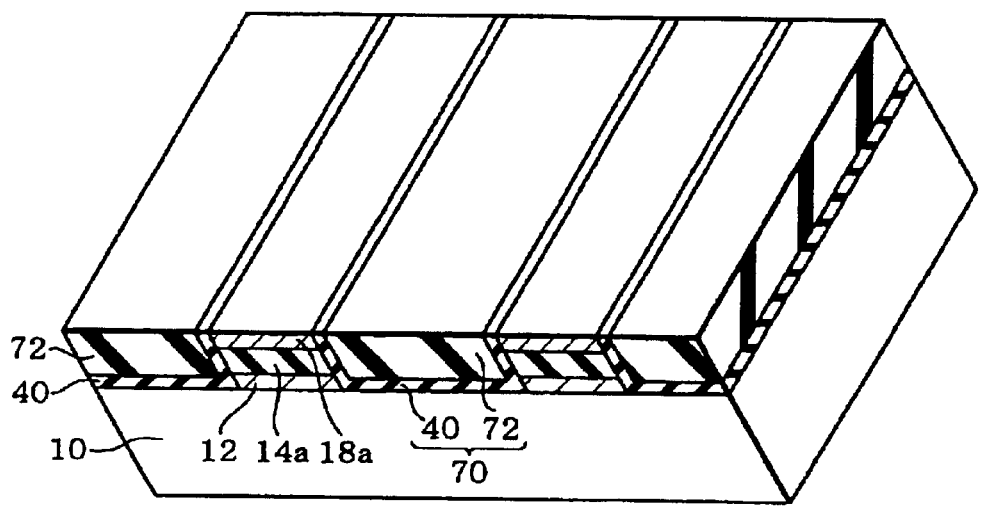
FIG. 11 is a sectional view schematically showing a fabrication step of a ferroelectric memory device.

Next, as shown in FIG. 11, the first insulating layer 72 and the resist layer R1 are etched back. Simultaneously with the etch-back process, the mask layer 60 is removed to expose the upper surface of the second conductive layer 18a. Any related art or known etch-back process may be used. In the etch-back step, the insulating layers 70 each including the first insulating layer 72 and the first hydrogen barrier film 40 are formed so as to cover at least the sidewalls of the lower electrodes 12.

Figure 12:
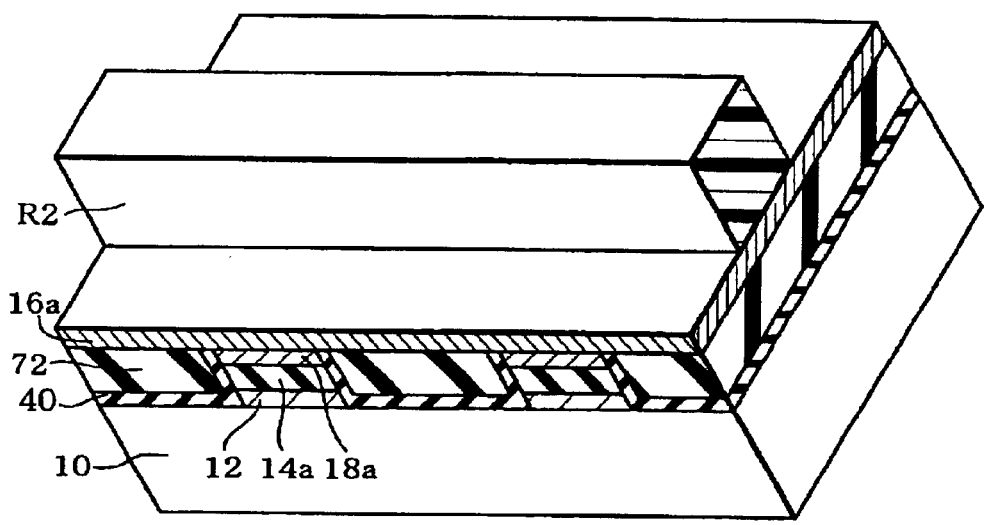
FIG. 12 is a sectional view schematically showing a fabrication step of a ferroelectric memory device.
Figure 13:
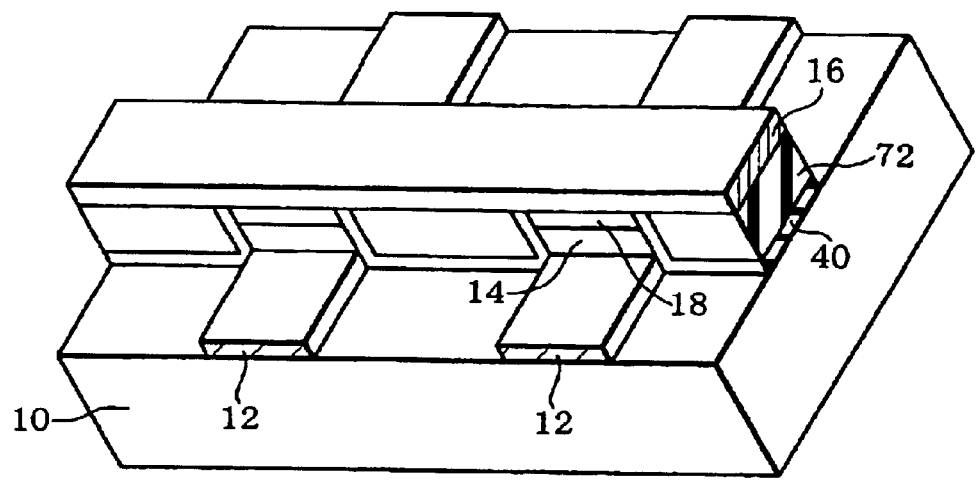
FIG. 13 is a sectional view schematically showing a fabrication step of a ferroelectric memory device.

Next, as shown in FIG. 12, a third conductive layer 16a is deposited on the entire surface. In order to form the third conductive layer 16, for example, the same material and the same formation method as those for the first conductive layer 12a may be used.

Next, a resist layer R2 with a predetermined pattern is formed on the third conductive layer 16a. The resist layer R2 is formed in the region in which the upper electrodes 16 are formed.

Next, using the resist layer R2 as a mask, the third conductive layer 16a, the second conductive layer 18a, the ferroelectric layer 14a, the first insulating layer 72, and the first hydrogen barrier film 40 are etched. By thus patterning the third conductive layer 16a, the upper electrodes 16 are formed. By patterning the second conductive layer 18a and the ferroelectric layer 14a, the intermediate electrode layer 18 and the ferroelectric section 14 are formed in each intersection between the upper electrodes 16 and the lower electrodes 12. Additionally, the first insulating layer 72 and the first hydrogen barrier film 40 remain under the upper electrodes 16 excluding the intersections between the upper electrodes 16 and the lower electrodes 12. The memory cell array 100 is thereby formed.

Figure 14:
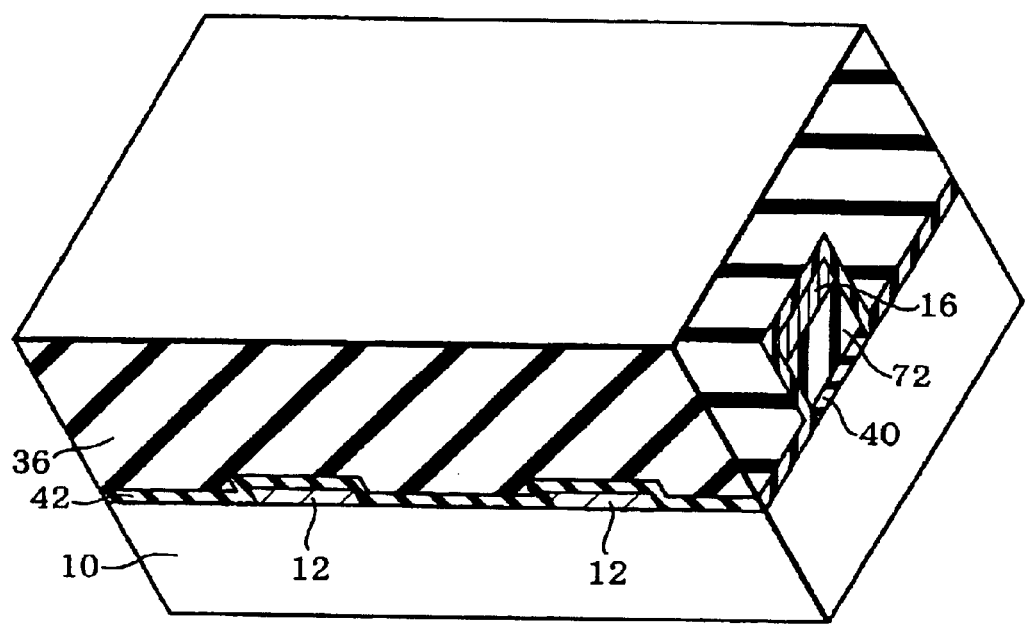
FIG. 14 is a sectional view schematically showing a fabrication step of a ferroelectric memory device.

Next, as shown in FIG. 1 and FIG. 14, as necessary, a second hydrogen barrier film 42 is formed on the memory cell array 100. In order to form the second hydrogen barrier film 42, the same material and method as those for the first hydrogen barrier film 40 may be used.

Next, a first protective layer 36 is formed on the second hydrogen barrier film 42 by a known method. As necessary, the first protective layer 36 is then planarized. Next, as necessary, a third hydrogen barrier film 44 is formed on the first protective layer in the memory cell array area A100. A second protective layer 38 is then formed over the first protective layer 36 and the third hydrogen barrier film 44.

2.2 Working effect

The working effects of the method of fabricating the ferroelectric memory device in this exemplary embodiment are described below.

1) In this exemplary embodiment, the second conductive layer 18a is formed on the ferroelectric layer 14a. Consequently, in the step of etching back the first insulating layer 72 and the mask layer 60, since the ferroelectric layer 14a is covered with the second conductive layer 18a, the ferroelectric layer 14a does not come into contact with the etchant. Therefore, the structure of the surface of the ferroelectric layer 14a does not become disordered, and degradation in characteristics can be prevented. That is, the capacitors are prevented from being damaged.

2) The ferroelectric layer 14a is formed on the unpatterned first conductive layer 12a. Since the ferroelectric layer 14a can be formed on the planar first conductive layer 12a, the ferroelectric layer 14a can be easily formed, and the freedom in the selection of the methods for forming the ferroelectric film is increased.

3) In general, when a conductive layer or a ferroelectric layer constituting a ferroelectric capacitor are etched, etching must be controlled so that fences composed of a reaction product are not formed on the sidewalls of the mask. For example, etching must be performed while retaining the substrate temperature at a high temperature of approximately 300° C., or etching must be performed so as to have a tapered cross section.

However, in this exemplary embodiment, by using the mask layer 60 as a mask, the first conductive layer 12a, the ferroelectric layer 14a, and the second conductive layer 18a are etched. The mask layer 60 is removed in the step of etching back the first insulating layer 72. Even if fences are formed on the sidewalls of the mask layer 60, the fences are removed when the mask layer 60 is removed. Consequently, when the second conductive layer 18a, etc., is etched, even if fences are formed due to the etching, the resultant fences are removed, and any problem due to fences can be avoided. Since it is not necessary to etch the second conductive layer 18a, etc., so as to have a tapered cross-section in order to avoid the formation of fences, it is possible to form laminates whose cross-sections are substantially perpendicular. Since it is not necessary to keep the substrate temperature high during etching, it is possible to etch the second conductive layer 18a, etc., using an ordinary etching system.

4) The second conductive layer 18a, the ferroelectric layer 14a, and the first conductive layer 12a are etched using the mask layer 60. Since the mask layer 60 has a higher selective ratio than a resist with respect to the second conductive layer 18a and the ferroelectric layer 14a, the thickness of the mask layer can be decreased, and therefore the mask size is easily controlled. Since no recession occurs during etching in contrast to the resist layer, it is possible to perform microfabrication with a pattern width of 0.35 $\mu$m or less.

3. Exemplary Variations 3.1 First Exemplary Variation

A first exemplary variation concerns to a method of forming the first insulating layer 72 which fills the spaces between the laminates each including the first conductive layer 12a, the ferroelectric layer 14a, and the second conductive layer 18a.

Figure 17:
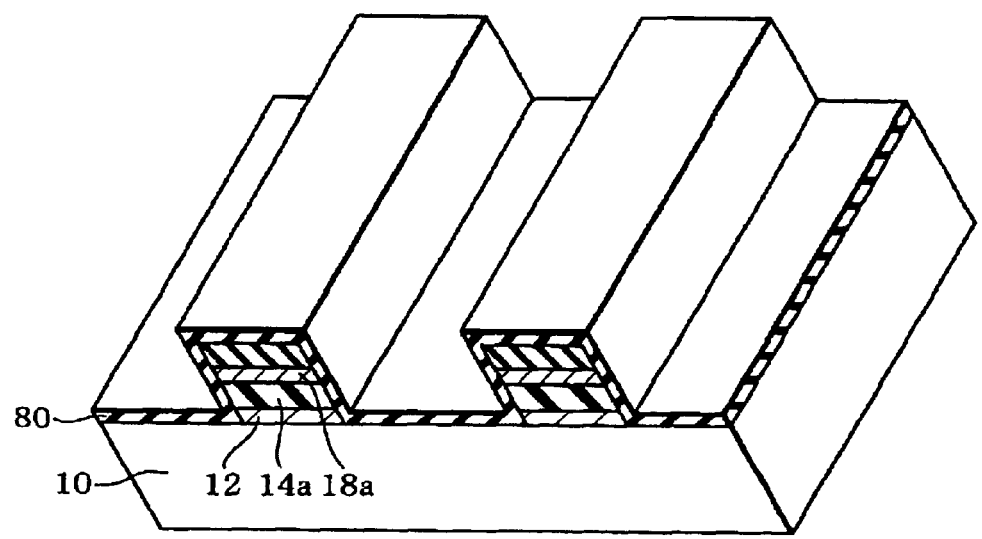
FIG. 17 is a sectional view schematically showing a key part in a fabrication step in a first exemplary variation.

First, as shown in FIG. 17, the surface of the first intralayer insulating layer 10 including the laminates is treated. The surface treatment is performed so that the surface of the first intralayer insulating layer 10 including the laminates has an affinity for the liquid material (e.g., mist) for the first insulating layer 72. As the surface treatment method, for example, the following method may be used.

A surface modification layer 80 is formed over the entire surface of the first intralayer insulating layer 10. The surface modification layer 80 has an affinity for the liquid material (mist) for the first insulating layer 72.

The material for the surface modification layer 80 is not particularly limited as long as it has an affinity for the liquid material (mist) for the first insulating layer 72. For example, hexamethyldisilazane, tetrahydrofuran, methanol, or methyl ethyl ketone may be used.

The surface modification layer 80 may be formed by a process using a liquid phase, such as a spin-coating process, a dipping process, or a mist deposition process.

Next, by a process that does not generate hydrogen, as shown in FIG. 9, the first insulating layer 72 is formed between the laminates. Specifically, the first insulating layer 72 may be formed by the method described below.

The liquid material (mist) for the first insulating layer 72 is applied over the surface of the first intralayer insulating layer 10. Since the surface modification layer 80 is disposed on the surface of the first intralayer insulating layer 10 including the laminates, wettability between the liquid material for the first insulating layer 72 and the first intralayer insulating layer 10 is enhanced, and the liquid material for the first insulating layer 72 easily flows into the spaces between the laminates. The deposition method for the liquid material for the first insulating layer 72 is not particularly limited, and for example, a LSMCD (Liquid Source Mist Chemical Deposition) process may be used. In the LSMCD process, the liquid material for the first insulating layer 72 more easily flows into the spaces between the laminates. As the liquid material for the first insulating layer 72, a liquid material of silicon oxide may be used.

The liquid material for the first insulating layer 72 is then heat-treated, and the first insulating layer is thereby formed.

In this exemplary variation, the following working effects are exhibited.

1) The insulating layer is formed by a process that does not generate hydrogen. Specifically, the liquid material (mist) for the first insulating layer 72 is applied over the first intralayer insulating layer 10, followed by heat treatment to form the insulating layer. Consequently, the ferroelectric layer 14a is prevented from being reduced.

2) Surface treatment is performed so that the surface of the first intralayer insulating layer 10 has an affinity for the liquid material for the first insulating layer. Consequently, the liquid material for the first insulating layer easily flows into the spaces between the laminates.

In this variation, the surface treatment step may be omitted. Additionally, this method may be employed in the state in which the first hydrogen barrier layer 40 is formed on the surfaces of the first intralayer insulating layer 10 and the ferroelectric capacitors 20.

3.2 Second variation

1) In this exemplary embodiment, using the mask layer 60 as a mask, the second conductive layer 18a, the ferroelectric layer 14a, and the first conductive layer 12a are etched. However, the present invention is not limited thereto, and without forming the mask layer 60, the second conductive layer 18a, the ferroelectric layer 14a, and the first conductive layer 12a may be etched using a resist layer as a mask.

2) The first insulating layer 72 may be planarized by a CMP process.

Figure 15:
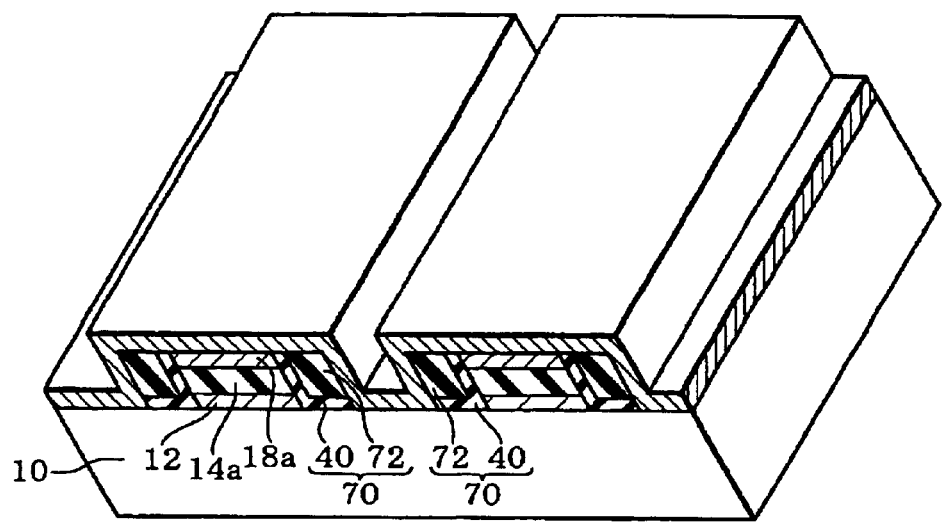
FIG. 15 is a sectional view schematically showing a variation in a second exemplary embodiment.
Figure 16:
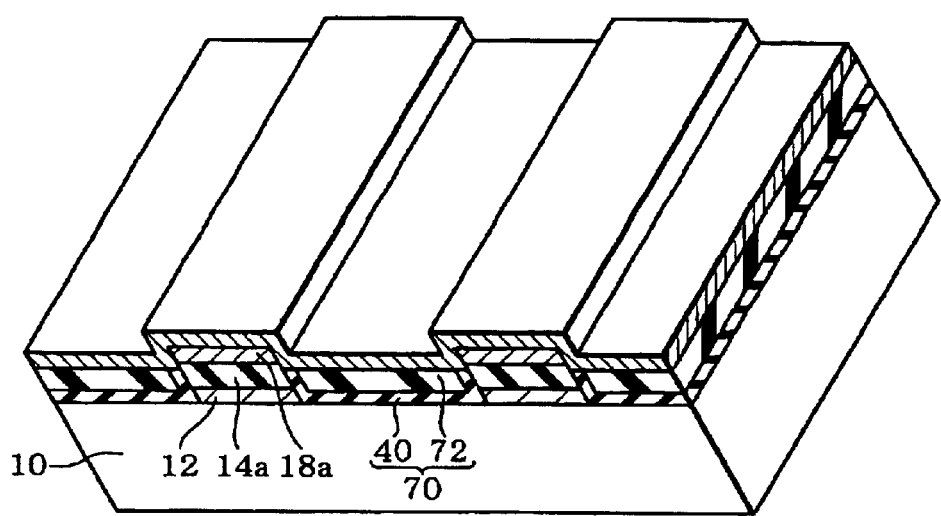
FIG. 16 is a sectional view schematically showing a variation in a second exemplary embodiment.

3) As long as the insulating layer 70 covers at least the lower electrode 12, as shown in FIG. 15, the insulating layer 70 in the center of the spaces between the adjacent laminates may be completely removed. Alternatively, as shown in FIG. 16, the upper surface of the insulating layer 70 may be lower than the upper surface of the second conductive layer 18a and may be higher than the upper surface of the first conductive layer 12a.

4) In this exemplary embodiment, the second conductive layer 18a, the ferroelectric layer 14a, and the first conductive layer 12a are simultaneously patterned. However, the present invention is not limited thereto. After the first conductive layer 12a is patterned, the ferroelectric layer 14a and the first conductive layer 12a may be formed.

5) The peripheral circuit unit 200 may be provided below the memory cell array.

EXAMPLES

Figure 18:
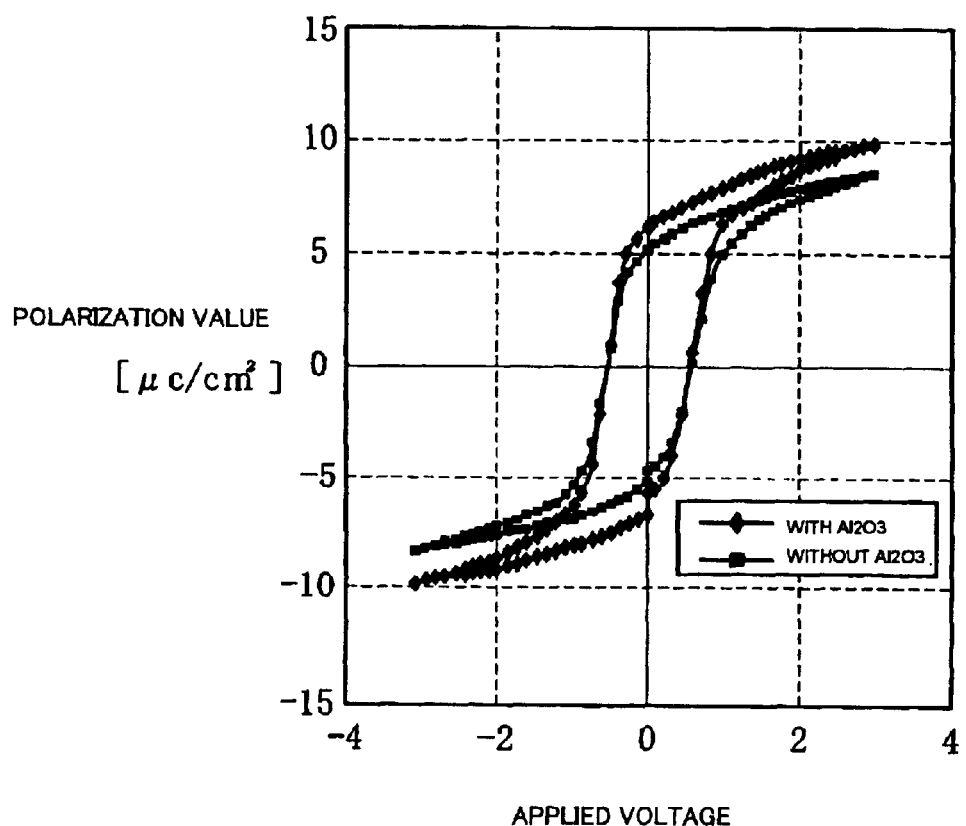
FIG. 18 is a graph showing hysteresis loops in an Example.
Figure 19:
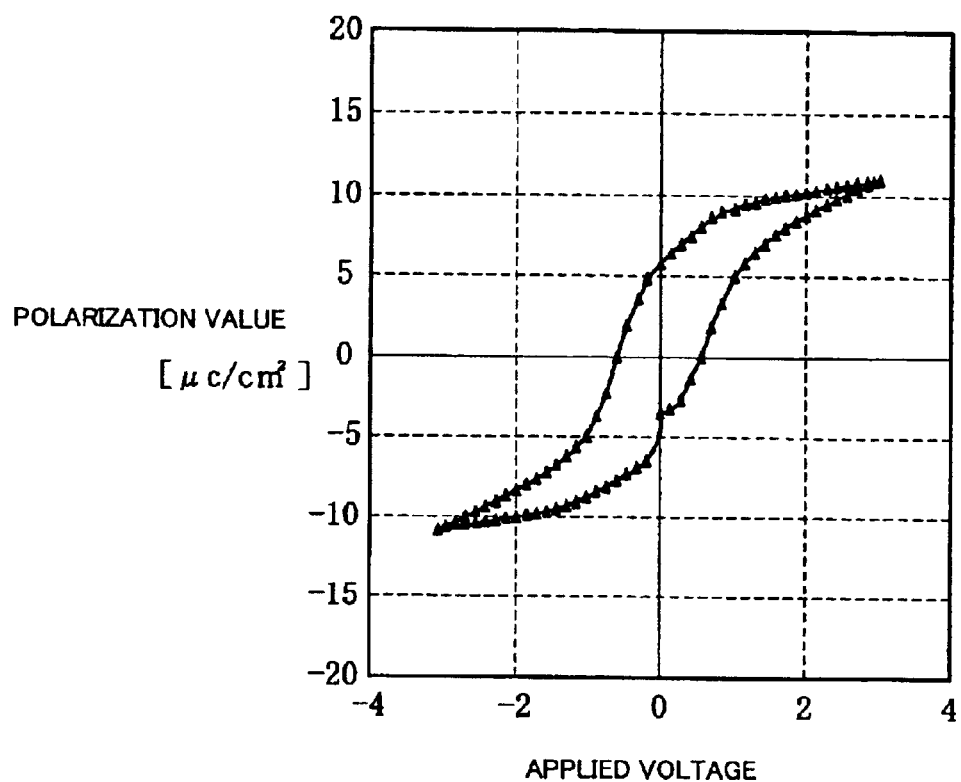
FIG. 19 is a graph showing a hysteresis loop in a Comparative Example.

A difference in the hysteresis loop between an Example and a Comparative Example was investigated. FIG. 18 is a graph showing hysteresis loops in the Example. FIG. 19 is a graph showing a hysteresis loop in the Comparative Example.

In Example, the structure of a memory cell array shown in FIGS. 2 to 5 was employed. In Example, the hysteresis loops were investigated in the cases when the first hydrogen barrier film (aluminum oxide film) 40 shown in FIGS. 2 to 5 was formed and when the first hydrogen barrier film (aluminum oxide film) 40 was not formed.

In the Comparative Example, a memory cell array had a structure in which a continuous ferroelectric layer was formed on a substrate including lower electrodes, and upper electrodes were formed on the ferroelectric layer.

As shown in FIGS. 18 and 19, in Example, the tangent of the hysteresis loop at a polarization value of 0 is more slanted compared to the Comparative Example. Therefore, in Example, the rectangularity is improved compared to the Comparative Example.

As is also clear from the graph, by forming the second hydrogen barrier film, the absolute value of Pr (remanent polarization) is increased.

The present invention is not limited to the exemplary embodiments described above, and various modifications can be made within the scope of the present invention.

What is claimed is:

1. A memory cell array, comprising:

ferroelectric capacitors arrayed in a matrix, each ferroelectric capacitor including:

a lower electrode;

an upper electrode;

a ferroelectric section disposed between the lower electrode and the upper electrode; and an intermediate electrode disposed between the ferroelectric section and the upper electrode, the ferroelectric section including side surfaces not facing toward the upper and lower electrode, the ferroelectric section and the intermediate electrode being disposed only in an intersection between the lower electrode and the upper electrode, and a hydrogen barrier layer covering the entire side surfaces of the ferroelectric section.

2. A ferroelectric memory device, comprising:

the memory cell array according to claim 1; and a hydrogen barrier film disposed above at least a plurality of the ferroelectric capacitors at a position covering the plurality of ferroelectric capacitors.

3. The ferroelectric memory device according to claim 2, further comprising a peripheral circuit unit to selectively write or read information in or from the memory cells, the hydrogen barrier film being not disposed on the peripheral circuit unit.

4. The ferroelectric memory device according to claim 2, further comprising an intralayer insulating layer disposed on the memory cell array, the hydrogen barrier film being disposed between the intralayer insulating layer and the memory cell array.

5. The ferroelectric memory device according to claim 4, the hydrogen barrier film being disposed on the intralayer insulating layer.

6. The ferroelectric memory device according to claim 2, the hydrogen barrier film functioning as an intralayer insulating layer.

7. A ferroelectric memory device, comprising:

the memory cell array according to claim 1.

8. The memory cell array according to claim 1,
the upper electrodes extending in a first direction,
the lower electrodes extending in a second direction,
the ferroelectric section including first side surfaces facing in the first direction and the second side surfaces facing in the second direction,
the hydrogen barrier film including a first hydrogen barrier film covering the first side surfaces of the ferroelectric section and a second hydrogen barrier film covering the second side surfaces of the ferroelectric section.

9. The memory cell array according to claim 8,
the intermediate electrode including first side surfaces facing in the first direction and second side surfaces facing in the second direction,
the upper electrode including first side surfaces facing in the first direction and second side surfaces facing in the second direction,
the second hydrogen barrier film covering the second side surfaces of the intermediate electrode and the upper electrode, and an upper surface of the upper electrode.

10. The memory cell array according to claim 8, an intralayer insulating layer being disposed on the first hydrogen barrier film.

11. The memory cell array according to claim 10, a height of a surface of the intralayer insulating layer being the same as a height of a surface of the intermediate electrode.

* * * * *